(12) United States Patent
Scanlan et al.

(10) Patent No.: US 10,672,624 B2
(45) Date of Patent: Jun. 2, 2020

(54) METHOD OF MAKING FULLY MOLDED PERIPHERAL PACKAGE ON PACKAGE DEVICE

(71) Applicant: DECA Technologies Inc., Tempe, AZ (US)

(72) Inventors: Christopher M. Scanlan, Chandler, AZ (US); William Boyd Rogers, Raleigh, NC (US); Craig Bishop, Tucson, AZ (US)

(73) Assignee: Deca Technologies Inc., Tempe, AZ (US)

( * ) Notice: Subject to any disclaimer, the term of this patent is extended or adjusted under 35 U.S.C. 154(b) by 28 days.

(21) Appl. No.: 16/012,678

(22) Filed: Jun. 19, 2018

(65) Prior Publication Data
US 2018/0330966 A1 Nov. 15, 2018

Related U.S. Application Data

(63) Continuation-in-part of application No. 15/479,020, filed on Apr. 4, 2017, now abandoned, which is a
(Continued)

(51) Int. Cl.
*H01L 23/00* (2006.01)
*H01L 21/48* (2006.01)
(Continued)

(52) U.S. Cl.
CPC ........ *H01L 21/486* (2013.01); *H01L 21/4853* (2013.01); *H01L 21/52* (2013.01);
(Continued)

(58) Field of Classification Search
CPC .............. H01L 21/561; H01L 21/6835; H01L 21/76838; H01L 21/78; H01L 21/568;
(Continued)

(56) References Cited

U.S. PATENT DOCUMENTS 4,740,414 A 4/1988 Shasheen
5,548,091 A 8/1996 Distefano et al.
(Continued)

FOREIGN PATENT DOCUMENTS

JP 3255970 A 11/1991
WO WO2009006284 1/2009
(Continued)

OTHER PUBLICATIONS

Kwak, Hocheol and Hubing. Todd, An Overview of Advanced Electronic Packaging Technology, May 1, 2007.
(Continued)

*Primary Examiner* — Nikolay K Yushin
(74) *Attorney, Agent, or Firm* — Booth Udall Fuller, PLC

(57) ABSTRACT

A method of making a semiconductor device may include providing a carrier comprising a semiconductor die mounting site. A build-up interconnect structure may be formed over the carrier. A first portion of a conductive interconnect may be formed over the build-up interconnect structure in a periphery of the semiconductor die mounting site. An etch stop layer and a second portion of the conductive interconnect may be formed over the first portion of the conductive interconnect. A semiconductor die may be mounted to the build-up interconnect at the semiconductor die mounting site. The conductive interconnect and the semiconductor die may be encapsulated with a mold compound. A first end of the conductive interconnect on the second portion of the conductive interconnect may be exposed. The carrier may be removed to expose the build-up interconnect structure. The first portion of the conductive interconnect may be etched to expose the etch stop layer.

21 Claims, 6 Drawing Sheets

Related U.S. Application Data continuation of application No. 15/151,384, filed on May 10, 2016, now Pat. No. 9,613,830, which is a continuation-in-part of application No. 14/930,514, filed on Nov. 2, 2015, now Pat. No. 9,576,919, which is a continuation-in-part of application No. 14/642,531, filed on Mar. 9, 2015, now Pat. No. 9,177,926, which is a continuation-in-part of application No. 14/584,978, filed on Dec. 29, 2014, now Pat. No. 9,337,086, which is a continuation of application No. 14/024,928, filed on Sep. 12, 2013, now Pat. No. 8,922,021, which is a continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600, application No. 16/012,678, which is a continuation-in-part of application No. 15/356,208, filed on Nov. 18, 2016, now Pat. No. 10,050,004.

(60) Provisional application No. 62/258,308, filed on Nov. 20, 2015, provisional application No. 61/950,743, filed on Mar. 10, 2014, provisional application No. 61/672,860, filed on Jul. 18, 2012.

(51) Int. Cl.
| | |
|---|---|
| *H01L 21/56* | (2006.01) |
| *H01L 21/683* | (2006.01) |
| *H01L 23/538* | (2006.01) |
| *H01L 23/498* | (2006.01) |
| *H01L 21/768* | (2006.01) |
| *H01L 23/48* | (2006.01) |
| *H01L 21/78* | (2006.01) |
| *H01L 21/52* | (2006.01) |
| *H01L 23/31* | (2006.01) |
| *H01L 25/10* | (2006.01) |
| *H01L 21/304* | (2006.01) |

(52) U.S. Cl.
CPC .......... *H01L 21/561* (2013.01); *H01L 21/568* (2013.01); *H01L 21/6835* (2013.01); *H01L 21/76838* (2013.01); *H01L 21/78* (2013.01); *H01L 23/48* (2013.01); *H01L 23/49827* (2013.01); *H01L 23/5389* (2013.01); *H01L 24/02* (2013.01); *H01L 24/05* (2013.01); *H01L 24/13* (2013.01); *H01L 24/19* (2013.01); *H01L 24/20* (2013.01); *H01L 24/92* (2013.01); *H01L 24/96* (2013.01); *H01L 24/97* (2013.01); *H01L 21/304* (2013.01); *H01L 23/3114* (2013.01); *H01L 23/3128* (2013.01); *H01L 23/3164* (2013.01); *H01L 23/49816* (2013.01); *H01L 23/562* (2013.01); *H01L 24/03* (2013.01); *H01L 24/11* (2013.01); *H01L 24/94* (2013.01); *H01L 25/105* (2013.01); *H01L 2221/68304* (2013.01); *H01L 2221/68331* (2013.01); *H01L 2221/68345* (2013.01); *H01L 2221/68359* (2013.01); *H01L 2221/68372* (2013.01); *H01L 2221/68381* (2013.01); *H01L 2224/0231* (2013.01); *H01L 2224/0239* (2013.01); *H01L 2224/02311* (2013.01); *H01L 2224/02313* (2013.01); *H01L 2224/02331* (2013.01); *H01L 2224/02377* (2013.01); *H01L 2224/03* (2013.01); *H01L 2224/03002* (2013.01); *H01L 2224/0332* (2013.01); *H01L 2224/0345* (2013.01); *H01L 2224/0346* (2013.01); *H01L 2224/03452* (2013.01); *H01L 2224/03462* (2013.01); *H01L 2224/03464* (2013.01); *H01L 2224/0401* (2013.01); *H01L 2224/04042* (2013.01); *H01L 2224/04105* (2013.01); *H01L 2224/056* (2013.01); *H01L 2224/05008* (2013.01); *H01L 2224/05024* (2013.01); *H01L 2224/0558* (2013.01); *H01L 2224/0569* (2013.01); *H01L 2224/05073* (2013.01); *H01L 2224/05082* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05187* (2013.01); *H01L 2224/05548* (2013.01); *H01L 2224/05568* (2013.01); *H01L 2224/05569* (2013.01); *H01L 2224/05571* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05687* (2013.01); *H01L 2224/11* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/133* (2013.01); *H01L 2224/1316* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13294* (2013.01); *H01L 2224/19* (2013.01); *H01L 2224/2101* (2013.01); *H01L 2224/214* (2013.01); *H01L 2224/215* (2013.01); *H01L 2224/73267* (2013.01); *H01L 2224/92* (2013.01); *H01L 2224/94* (2013.01); *H01L 2224/95001* (2013.01); *H01L 2224/96* (2013.01); *H01L 2225/1035* (2013.01); *H01L 2225/1094* (2013.01); *H01L 2924/00* (2013.01); *H01L 2924/00012* (2013.01); *H01L 2924/00014* (2013.01); *H01L 2924/014* (2013.01); *H01L 2924/0105* (2013.01); *H01L 2924/01013* (2013.01); *H01L 2924/01023* (2013.01); *H01L 2924/01028* (2013.01); *H01L 2924/01029* (2013.01); *H01L 2924/01047* (2013.01); *H01L 2924/01074* (2013.01); *H01L 2924/01079* (2013.01); *H01L 2924/01082* (2013.01); *H01L 2924/04941* (2013.01); *H01L 2924/12041* (2013.01); *H01L 2924/12042* (2013.01); *H01L 2924/1304* (2013.01); *H01L 2924/13091* (2013.01); *H01L 2924/1433* (2013.01); *H01L 2924/181* (2013.01); *H01L 2924/18161* (2013.01); *H01L 2924/18162* (2013.01); *H01L 2924/351* (2013.01); *H01L 2924/3511* (2013.01)

(58) Field of Classification Search
CPC ... H01L 21/52; H01L 21/486; H01L 21/4853;
H01L 21/304; H01L 23/5389; H01L
23/49827; H01L 23/48; H01L 23/562;
H01L 23/3128; H01L 23/3114; H01L
23/3164; H01L 25/105; H01L 25/16;
H01L 25/0657; H01L 25/0753; H01L
2221/68381; H01L 2221/68372; H01L
2221/68359; H01L 2221/68345; H01L
2221/68331; H01L 2221/68304; H01L
2224/95001; H01L 2224/13147; H01L
2224/13124; H01L 2224/13113; H01L
2224/131; H01L 2224/12105; H01L
2224/11901; H01L 2224/11849; H01L
2224/11464; H01L 2224/1145; H01L
2224/05572; H01L 2224/05647; H01L
2224/05166; H01L 2224/04105; H01L
2224/0401; H01L 2224/214; H01L
2224/2101; H01L 2224/0345; H01L
2224/056; H01L 2224/05187; H01L
2224/05171; H01L 2224/05169; H01L
2224/05124; H01L 2224/05082; H01L
2224/05073; H01L 2224/04042; H01L
2224/03002; H01L 2224/13024; H01L
2224/02311; H01L 2224/05568; H01L
2224/05687; H01L 2224/05671; H01L
2224/05639; H01L 2224/05624; H01L
2224/05611; H01L 2224/05573; H01L
2224/05548; H01L 2224/03452; H01L
2224/05024; H01L 2224/05569; H01L
2224/0558; H01L 2224/02377; H01L
2224/02331; H01L 2224/02313; H01L
2224/96; H01L 2224/05666; H01L
2224/05655; H01L 2224/0239; H01L
2224/215; H01L 2224/03462; H01L
2224/03464; H01L 2224/05644; H01L
2224/05664; H01L 2224/05669; H01L
2224/05147; H01L 2224/11452; H01L
2224/11462; H01L 2224/1132; H01L
2224/13155; H01L 2224/13144; H01L
2224/13139; H01L 2224/13116; H01L
2224/0231; H01L 2224/19; H01L
2224/11; H01L 2224/94; H01L
2224/05164; H01L 2224/05144; H01L
2224/13111; H01L 2224/05155; H01L
2224/0569; H01L 2224/0332; H01L
2224/11334; H01L 2224/1316; H01L
2224/13294; H01L 2224/133; H01L
2224/0346; H01L 2224/03; H01L
2224/73267; H01L 2224/05571; H01L
2225/1035; H01L 2225/1094; H01L
2924/18162; H01L 2924/13091; H01L
2924/12041; H01L 2924/3511; H01L
2924/12042; H01L 2924/351; H01L
2924/181; H01L 2924/01082; H01L
2924/01074; H01L 2924/00; H01L
2924/01029; H01L 2924/0105; H01L
2924/01028; H01L 2924/01013; H01L
2924/01079; H01L 2924/01047; H01L
2924/04941; H01L 2924/00014; H01L
2224/92; H01L 2924/01023; H01L
2924/00012; H01L 2924/014; H01L
2924/18161; H01L 24/73; H01L 24/97;
H01L 24/81; H01L 24/19; H01L 24/96
See application file for complete search history.

(56) References Cited

U.S. PATENT DOCUMENTS

| | | |
|---|---|---|
| 7,456,496 B2 | 11/2008 | Hwee et al. |
| 7,476,980 B2 | 1/2009 | Rebibis et al. |
| 7,482,203 B2 | 1/2009 | Song et al. |
| 7,550,857 B1 | 6/2009 | Longo et al. |
| 7,777,351 B1 | 8/2010 | Berry et al. |
| 7,791,206 B2 * | 9/2010 | Takeuchi ............ H01L 21/6835 257/774 |
| 7,829,380 B2 | 11/2010 | Irsigler et al. |
| 7,843,052 B1 | 11/2010 | Yoo et al. |
| 7,888,184 B2 | 2/2011 | Shim et al. |
| 8,030,770 B1 | 10/2011 | Juskey et al. |
| 8,237,259 B2 | 8/2012 | Pressel et al. |
| 8,288,209 B1 | 10/2012 | Chi et al. |
| 8,354,304 B2 | 1/2013 | Chow et al. |
| 8,436,255 B2 | 5/2013 | Goh |
| 8,487,435 B2 | 7/2013 | Juskey et al. |
| 8,653,674 B1 | 2/2014 | Darveaux et al. |
| 8,669,655 B2 | 3/2014 | Geitner et al. |
| 2003/0027373 A1 | 2/2003 | Distefano et al. |
| 2003/0092217 A1 | 5/2003 | Coyle |
| 2003/0164554 A1 | 9/2003 | Fee et al. |
| 2005/0208700 A1 | 9/2005 | Kwon et al. |
| 2006/0275949 A1 | 12/2006 | Farnworth et al. |
| 2006/0291029 A1 | 12/2006 | Lin et al. |
| 2008/0237828 A1 | 10/2008 | Yang |
| 2009/0302484 A1 | 12/2009 | Lee et al. |
| 2010/0052135 A1 | 3/2010 | Shim |
| 2010/0167471 A1 | 7/2010 | Jin et al. |
| 2010/0195299 A1 | 8/2010 | Souriau et al. |
| 2010/0308474 A1 | 12/2010 | Shibuya et al. |
| 2011/0001215 A1 | 1/2011 | Lam |
| 2011/0042796 A1 | 2/2011 | Chang et al. |
| 2011/0095413 A1 | 4/2011 | Barth et al. |
| 2011/0156250 A1 | 6/2011 | Goh et al. |
| 2011/0186977 A1 | 8/2011 | Chi et al. |
| 2011/0193205 A1 | 8/2011 | Hsieh |
| 2011/0202896 A1 | 8/2011 | Scanlan et al. |
| 2011/0250396 A1 | 10/2011 | Matsutani et al. |
| 2012/0032314 A1 | 2/2012 | Chen et al. |
| 2012/0119373 A1 | 5/2012 | Hunt |
| 2012/0133001 A1 | 5/2012 | Tkaczyk et al. |
| 2013/0026658 A1 | 1/2013 | Chen |
| 2013/0062760 A1 | 3/2013 | Hung et al. |
| 2013/0168848 A1 | 7/2013 | Lin et al. |
| 2013/0168849 A1 | 7/2013 | Scanlan |
| 2013/0270682 A1 | 10/2013 | Hu et al. |
| 2013/0307140 A1 | 11/2013 | Huang et al. |
| 2013/0334698 A1 | 12/2013 | Mohammed et al. |
| 2014/0042600 A1 | 2/2014 | Kim et al. |
| 2014/0054802 A1 | 2/2014 | Shim |
| 2014/0057394 A1 | 2/2014 | Ramasamy et al. |

FOREIGN PATENT DOCUMENTS

| | | |
|---|---|---|
| WO | WO2009009436 | 1/2009 |
| WO | WO2010/080068 A1 | 7/2010 |

OTHER PUBLICATIONS

Kripesh, Vaidyanathan et al., Design and Development of a Multi-Die Embedded Micro Wafer Level Package, Institute of Microelectronics, Singapore, 2008.
Micronews, Fan-in WLCSP matures, what's next?, 3 D Packaging Magazine, Issue 14, Feb. 2008, pp. 2-5.
Th, E.K. et al, Encapsulation Challenges for Wafer Level Packaging, Electronics Packaging Technology Conference, 2009.
R Anderson, et al., Advances in WLCSP Technologies for Growing Market Needs, SMTA's 6th AMual International Wafer Level Packaging Conference, Oct. 27-30, 2009, Santa Clara, CA.
Kanth et al., Design and Development of True-CSP, United Test & Assembly Center Ltd (UTAC).
Hunt, John, Value Engineered Wafer Level Packages for Mobile Devices, Jul. 9, 2013.

(56) References Cited

OTHER PUBLICATIONS

Fan et al., Design and optimization of thermo-mechanical reliability in wafer level packaging, Jul. 4, 2009.
Motohashi et al., System in Wafer-Level Package Technology with RDL-first Process, Kanagawa, Japan.
Nishio, 3D package technologies review with gap analysis for mobile application requirements, STATS ChipPAC, Japan, Apr. 22, 2014.
Krohnert et al., System-in-package (SiP) on wafer level, enabled by fan-out WLP (eWLB), Portugal.
Flack et al., Lithography Technique to Reduce the Alignment Errors from Die Placement in Fan-out Wafer Level Packaging Applications, San Jose, CA.
Exposed, Merriam-Webster, merriam-webster.com/dictionary/exposed.
Thick Copper(Cu) RDL, Chipbond website.
Yannou, An overview of recent panel-scale packaging developments throughout the industry, MiNaPAD conference, Grenoble, Apr. 24, 2012.
WLCSP (FiWLP Technology), Wafer level chip scale package.

* cited by examiner

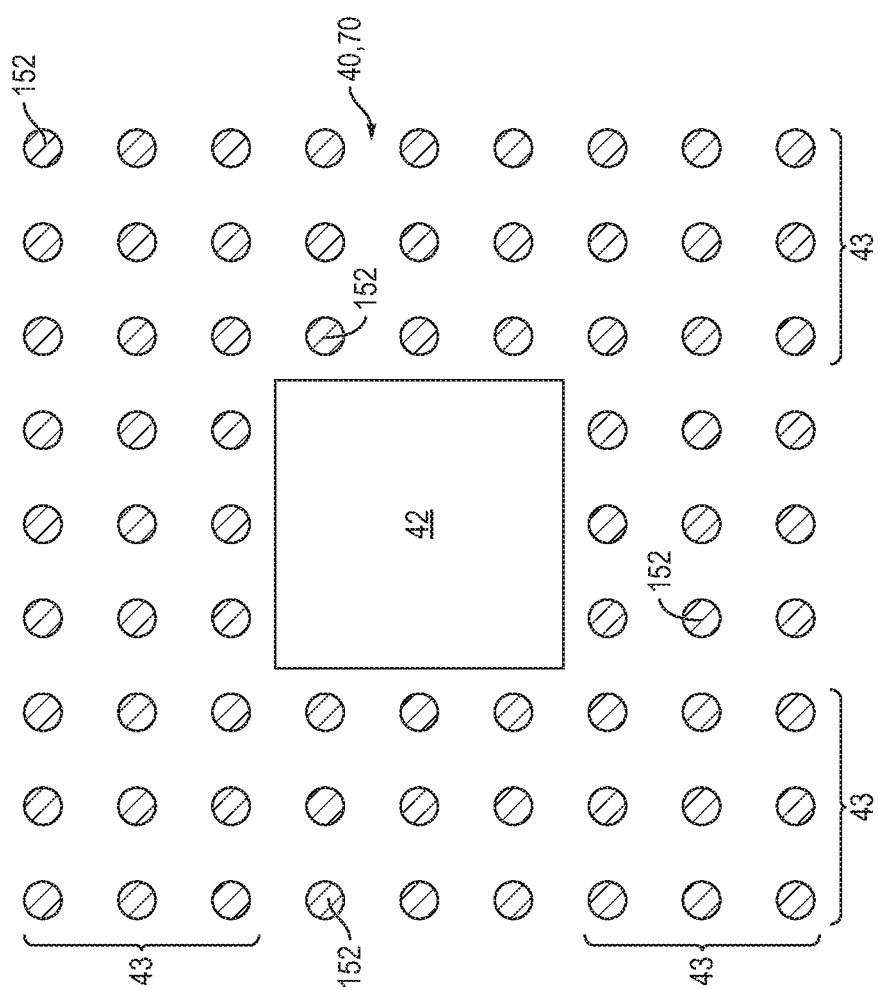

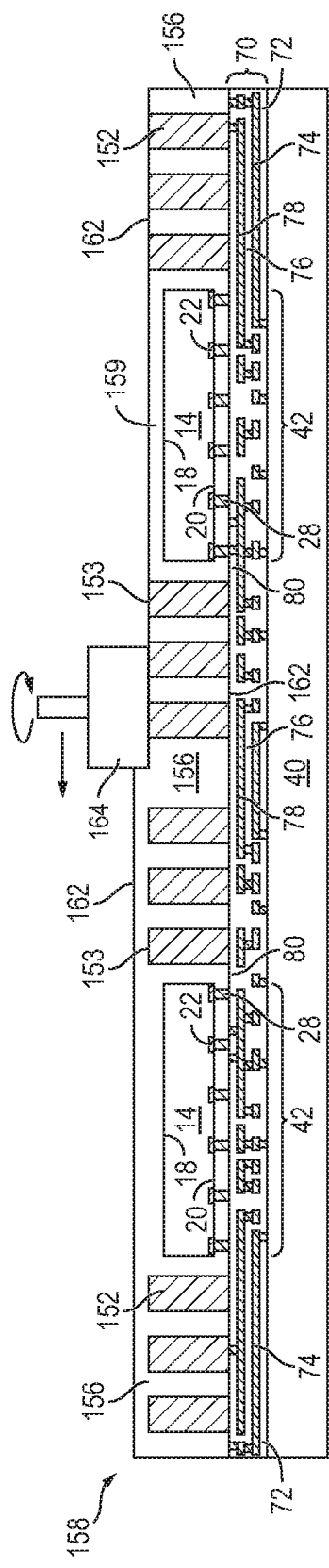
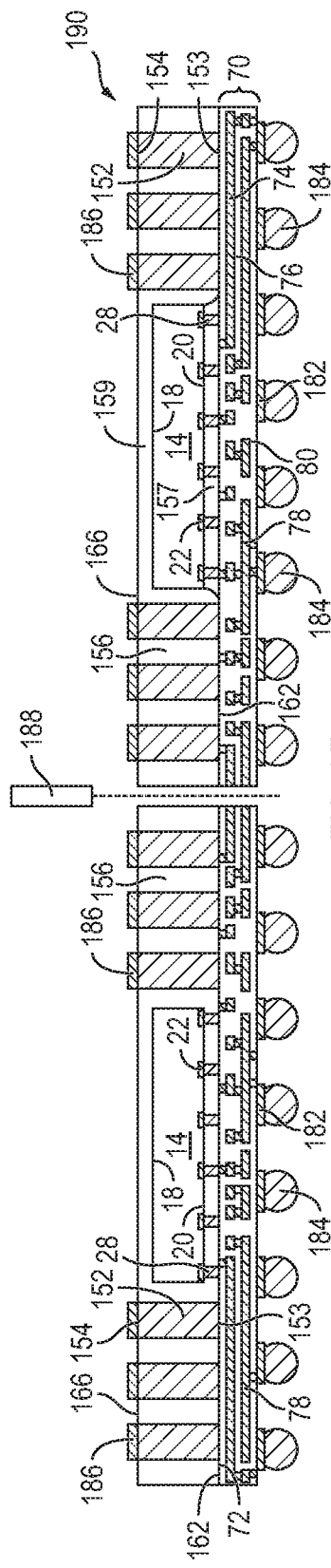

US 10,672,624 B2

METHOD OF MAKING FULLY MOLDED PERIPHERAL PACKAGE ON PACKAGE DEVICE

CROSS-REFERENCE TO RELATED APPLICATIONS

This application is a continuation-in-part of U.S. application Ser. No. 15/479,020, entitled "Fully Molded Peripheral Package On Package Device," which was filed Apr. 4, 2017 and is a continuation of U.S. application Ser. No. 15/151,384, entitled "Fully Molded Peripheral Package On Package Device," which was filed May 10, 2016, which application claims the benefit, including the filing date, of U.S. Provisional Patent No. 62/258,308, entitled "Three-Dimensional Fully Molded Semiconductor Package," which was filed on Nov. 20, 2015, and is also a continuation in part of U.S. application Ser. No. 14/930,514, entitled "Semiconductor Device and Method Comprising Redistribution Layers," which was filed on Nov. 2, 2015, now issued as U.S. Pat. No. 9,576,919, which application is a continuation in part of U.S. application Ser. No. 14/642,531, entitled "Semiconductor Device and Method Comprising Thickened Redistribution Layers," which was filed on Mar. 9, 2015, now issued as U.S. Pat. No. 9,177,926, which application claims the benefit of U.S. Provisional Patent No. 61/950,743, entitled "Wafer-Level-Chip-Scale-Packages with Thick Redistribution Layer Traces," which was filed on Mar. 10, 2014, and U.S. application Ser. No. 14/642,531 is also a continuation in part of U.S. application Ser. No. 14/584,978, entitled "Die Up Fully Molded Fan-Out Wafer Level Packaging," which was filed on Dec. 29, 2014, now issued as U.S. Pat. No. 9,337,086, which application is a continuation of U.S. application Ser. No. 14/024,928, entitled "Die Up Fully Molded Fan-Out Wafer Level Packaging," which was filed on Sep. 12, 2013, now issued as U.S. Pat. No. 8,922,021, which application is a continuation of U.S. application Ser. No. 13/632,062, entitled "Die Up Fully Molded Fan-Out Wafer Level Packaging," which was filed on Sep. 30, 2012, now issued as U.S. Pat. No. 8,535,978, which application is a continuation in part of U.S. application Ser. No. 13/341,654, entitled "Fully Molded Fan-Out," which was filed on Dec. 30, 2011, now issued as U.S. Pat. No. 8,604,600, and application Ser. No. 13/632,062 further claims the benefit of the filing date of U.S. Provisional Patent No. 61/672,860, entitled "Fan-Out Semiconductor Package," which was filed on Jul. 18, 2012, the disclosures of all of which are hereby incorporated herein by this reference. This application is also a continuation-in-part of U.S. application Ser. No. 15/356,208, entitled "Fully Molded Peripheral Package On Package Device," which was filed Nov. 18, 2016, now pending, which application claims the benefit, including the filing date, of U.S. Provisional Patent No. 62/258,308, entitled "Three-Dimensional Fully Molded Semiconductor Package," which was filed on Nov. 20, 2015, the disclosures of which are hereby incorporated herein by this reference.

TECHNICAL FIELD

The disclosure relates to a fully molded semiconductor package and method of making the same, which includes a peripheral area around a semiconductor die comprising vertically oriented electrical interconnects that facilitate package on package (PoP) stacking of multiple semiconductor packages.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

On opportunity exists for improved semiconductor manufacturing and devices. Accordingly, in an aspect, a method of making a semiconductor device may comprise providing a carrier comprising a semiconductor die mounting site. A build-up interconnect structure may be formed over the carrier. A first portion of a conductive interconnect may be formed over the build-up interconnect structure in a periphery of the semiconductor die mounting site. An etch stop layer may be formed over the first portion of the conductive interconnect. A second portion of the conductive interconnect may be formed over the etch stop layer and over the first portion of the conductive interconnect. A semiconductor die may be mounted facedown to the build-up interconnect at the semiconductor die mounting site. The conductive interconnect and the semiconductor die may be encapsulated with a mold compound. A first end of the conductive interconnect on the second portion of the conductive interconnect may be exposed. The carrier may be removed to expose the build-up interconnect structure. The first portion of the conductive interconnect may be etched to expose the etch stop layer.

The method of making the semiconductor device by forming the etch stop layer may further comprise forming a layer of solder comprising a thickness in a range of 20-40 micrometers (μm). The solder etch stop layer may be reflowed to form a bump after etching the second portion of the conductive interconnect to expose the etch stop layer. The etch stop layer may be formed as a solderable surface finish that remains over the first portion of the conductive interconnect when the first portion of the conductive interconnect is coupled to a conductive bump. The etch stop layer may be formed of a material that is not etched by a first etching chemistry that etches the second portion of the conductive interconnect, and the second portion of the conductive interconnect may be formed of a copper material that is not etched by a second etching chemistry that etches the etch stop layer. The first end of the conductive interconnect may be exposed with a grinding process that removes a portion of the mold compound.

In another aspect, a method of making a semiconductor device may comprise providing a redistribution layer (RDL) comprising a die mounting site. Conductive interconnects may be formed over the redistribution layer in a periphery of the semiconductor die mounting site. A facedown semiconductor die may be mounted to the RDL at the semiconductor die mounting site. The conductive interconnects and semiconductor die may be encapsulated with mold compound. First ends of the conductive interconnects may be exposed. The conductive interconnects may be etched to recess the first ends of the conductive interconnects with respect to the mold compound.

The method of making the semiconductor device may further comprise the conductive interconnects comprising a first portion, a second portion, and an etch stop layer disposed between the first portion and the second portion. The etch stop layer may be formed of solder, and the solder etch stop layer may be reflowed to form a bump after etching the second portion of the conductive interconnects to expose the etch stop layer of each conductive interconnect. The etch stop layer may be formed as a surface finish that remains over the first portion of the conductive interconnects. Providing the RDL may further comprise forming a build-up interconnect structure, the build-up interconnect structure connecting the semiconductor die and the conductive interconnects. An underfill material may be disposed between the facedown semiconductor die and the RDL. A surface mount device (SMD) may be mounted to the RDL adjacent the semiconductor die and the conductive interconnects.

In another aspect, a method of making a semiconductor device may comprise providing a carrier comprising a RDL and semiconductor die mounting site. Conductive interconnects may be disposed over the carrier and RDL in a periphery of the semiconductor die mounting site. A semiconductor die may be mounted and coupled to the RDL at the semiconductor die mounting site. The conductive interconnects and semiconductor die may be encapsulated with mold compound. First ends of the conductive interconnects may be exposed.

The method of making the semiconductor device may further comprise the conductive interconnects comprising a first portion, a second portion, and an etch stop layer disposed between the first portion and the second portion. An offset may be provided between an end of each of the conductive interconnects with respect to a surface of the mold compound, and a solder bump may be provided over the end of each of the conductive interconnects. The etch stop layer may be formed as a surface finish that remains over the first portion of the conductive interconnects. The RDL may be provided as part of a build-up interconnect structure disposed over a temporary carrier. A land grid array (LGA) may be coupled to the RDL. The conductive interconnects may be formed before being coupled to the RDL.

The inventors are also aware of the normal precepts of English grammar. Thus, if a noun, term, or phrase is intended to be further characterized, specified, or narrowed in some way, such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material, or acts in support of the function. Thus, even when the claims recite a "means for performing the function of . . . " or "step for performing the function of . . . ," if the claims also recite any structure, material, or acts in support of that means or step, or to perform the recited function, it is the clear intention of the inventors not to invoke the provisions of 35 U.S.C. § 112112(f). Moreover, even if the provisions of 35 U.S.C. § 112(f), are invoked to define the claimed aspects, it is intended that these aspects not be limited only to the specific structure, material, or acts that are described in the preferred embodiments, but in addition, include any and all structures, material, or acts that perform the claimed function as described in alternative embodiments or forms in the disclosure, or that are well-known present or later-developed, equivalent structures, material, or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 2A-2H illustrate the formation of fully molded peripheral PoP devices.

DETAILED DESCRIPTION

Figure 1A:
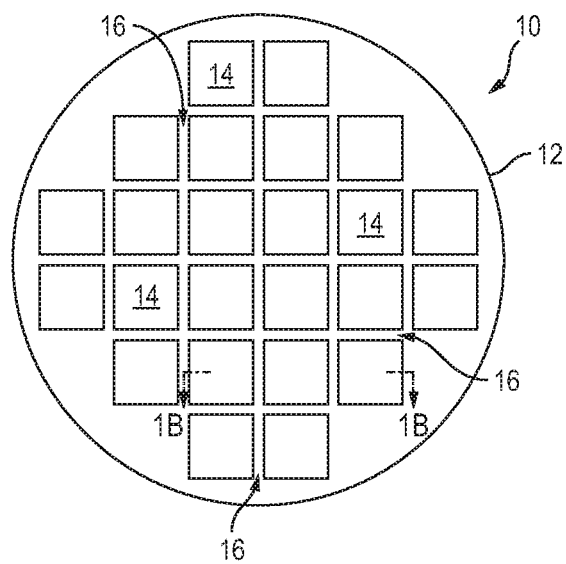
FIGS. 1A-1C illustrate semiconductor die from a native wafer comprising electrical interconnects.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

The elements, actions, or features of items described herein may be performed in the order or sequence shown, but need not be. Fewer elements, or additional elements, as well as the order or sequence of the various elements described herein may be modified without departing from the spirit and scope of the present disclosure.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed.

Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIG. 1A shows a plan view of a semiconductor wafer or native wafer 10 with a base substrate material 12, such as, without limitation, silicon, germanium, gallium arsenide, indium phosphide, or silicon carbide, for structural support. A plurality of semiconductor die or components 14 can be formed on wafer 10 separated by a non-active, inter-die wafer area or saw street 16 as described above. The saw street 16 can provide cutting areas to singulate the semiconductor wafer 10 into the individual semiconductor die 14.

Figure 1B:
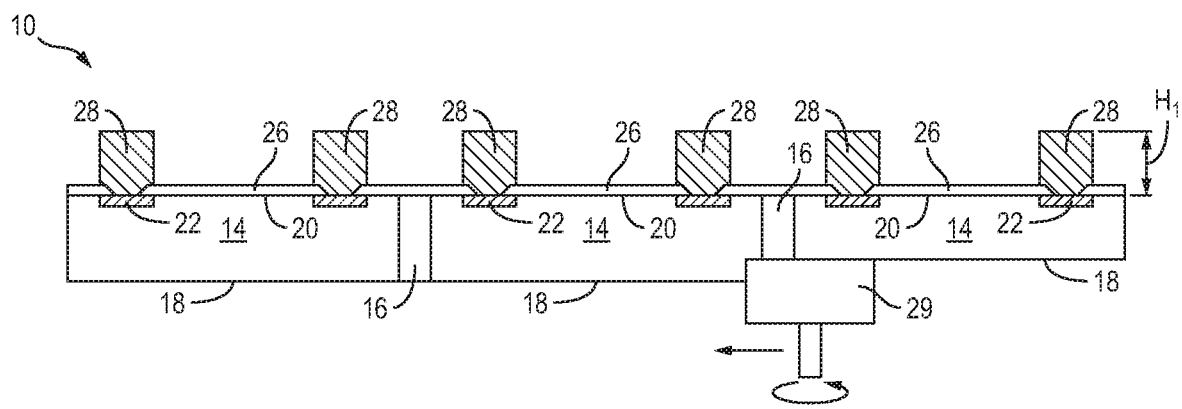

FIG. 1B shows a cross-sectional profile view taken along the section line 1B shown in FIG. 1A, that illustrates a plurality of semiconductor die 14 from the native wafer 10, shown in FIG. 1A. Each semiconductor die 14 has a backside or back surface 18 and an active surface 20 opposite the backside 18. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuits. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 can be, or operate as, contact pads or bond pads electrically coupled or connected to the circuits on active surface 20. Conductive layer 22 can be formed as contact pads disposed side-by-side a first distance from the edge of semiconductor die 14, as shown in FIG. 1B. Conductive layer 22 can also be formed as contact pads that are offset in multiple rows such that a first row of contact pads is disposed a first distance from the edge of the die, and a second row of contact pads alternating with the first row is disposed a second distance from the edge of the die. Additionally, conductive layer 22 can be formed as contact pads that are arranged as a full array of pads distributed over the active area of the semiconductor die or chip. In some instances the contact pads can be arranged in an irregular or asymmetrical array with differing or various spacing among the contact pads.

FIG. 1B also shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B also shows conductive bumps, conductive interconnects, or electrical interconnect structures 28 that can be formed as columns, pillars, posts, thick RDLs, bumps, or studs that are formed of copper or other suitable conductive material, which are disposed over, and coupled or connected to, conductive layer 22. Conductive bumps 28 can be formed directly on conductive layer 22 using patterning and metal deposition processes such as printing, PVD, CVD, sputtering, electrolytic plating, electroless plating, metal evaporation, metal sputtering, or other suitable metal deposition process. Conductive bumps 28 can be one or more layers of Al, Cu, Sn, Ni, Au, Ag, palladium (Pd), or other suitable electrically conductive material and can include one or more layers. In some instances, one or more UBM layers of Al, Cu, Sn, Ni, Au, Ag, Pd, or other suitable electrically conductive material can optionally be disposed between conductive layer 22 and conductive bumps 28. In some embodiments, conductive bumps 28 can be formed by depositing a photoresist layer over the semiconductor die 14 and conductive layer 22 while the semiconductor die 14 are part of the semiconductor wafer 10. A portion of the photoresist layer can be exposed and removed by an etching development process, and the conductive bumps 28 can be formed as copper studs, bumps, or pillars in the removed portion of the photoresist and over conductive layer 22 using a selective plating process. The photoresist layer can be removed leaving conductive bumps 28 that provide for subsequent mechanical and electrical interconnection and a standoff with respect to active surface 20. Conductive bumps 28 may include a height H1 in a range of 5-100 µm or a height in a range of 20-50 µm, or a height of about 25 µm. The conductive bumps 28 may be formed as solder bumps on the native wafer 10, and may include plated Cu pillar bumps with a SnAg "cap" or plated SnAg bumps or any other kind of flip-chip bump.

FIG. 1B also shows the semiconductor wafer 10 can undergo an optional grinding operation with a grinder 29 to planarize the surface and reduce a thickness of the semiconductor wafer 10. A chemical etch can also be used to remove and planarize a portion of the semiconductor wafer 10.

Figure 1C:
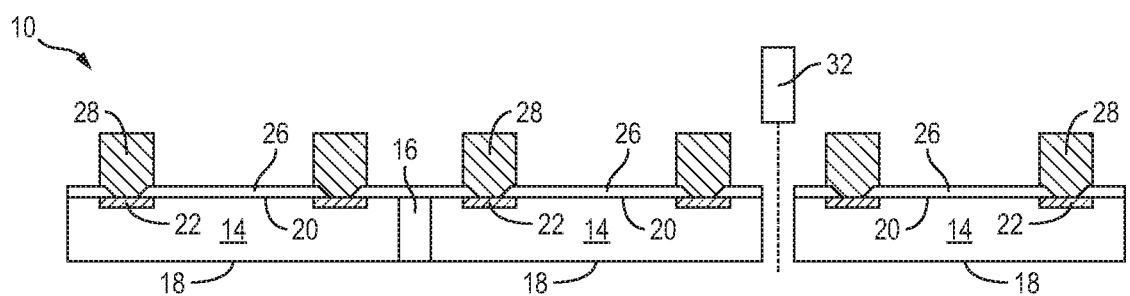

FIG. 1C shows semiconductor wafer 10 can be singulated through gaps or saw streets 16 using laser grooving, a saw blade or laser cutting tool 32, or both to singulate the semiconductor wafer 10 into individual semiconductor die 14 with conductive bumps 28. The semiconductor die 14 can then be used as part of a subsequently formed semiconductor component package as discussed in greater detail below with respect to FIGS. 2A-4B.

Figure 2A:
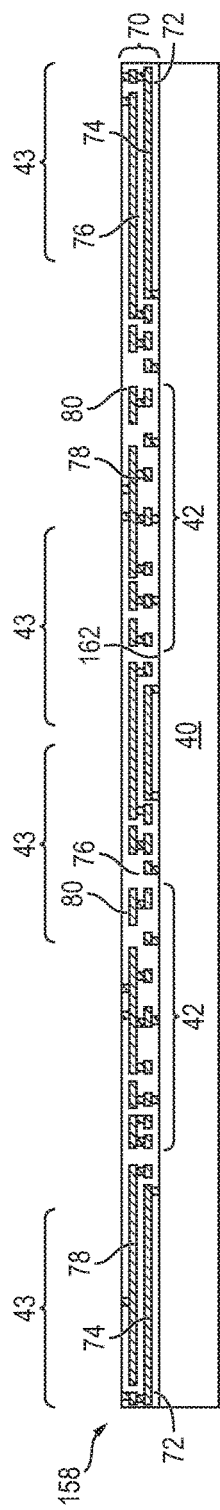

FIG. 2A shows providing a temporary carrier, carrier, temporary substrate, substrate, or rigid RDL substrate 40, on which subsequent processing of the semiconductor devices, semiconductor component packages, or fully-molded peripheral PoP devices or packages 190 can occur, as described in greater detail herein. The carrier 40 can contain base material such as metal, silicon, polymer, polymer composite, ceramic, glass, glass epoxy, stainless steel, or other suitable low-cost, rigid material or bulk semiconductor material for structural support. The carrier can be circular, square, rectangular, or other suitable or desirable shape and can include any desirable size, such as a size equal to, similar to, or slightly larger or smaller than a reconstituted wafer or panel that is subsequently formed on or over the carrier 40. In some instances, a diameter, length, or width of the carrier can be equal to, or about, 200 millimeters (mm), 300 mm, or more.

When the carrier 40 is formed as a rigid RDL substrate, the substrate may comprise a single routing layer or RDL, or multiple routing or RDL layers, as described below with respect to build-up interconnect structure 70. However, the rigid RDL substrate, unlike a temporary carrier, would not be subsequently removed as shown and described with respect to FIG. 2F, but would be incorporated as part of a final package or semiconductor device 190. The rigid RDL substrate would be rigid enough to support the processing and formation of the semiconductor devices 190 as shown and described herein, and provide for the desired package interconnect.

The carrier 40, and the interconnect structure 70 described below, can comprise a plurality of semiconductor die mounting sites or die attach areas 42 spaced or disposed across a surface of the carrier 40, according to a design and configuration of the final semiconductor devices 190, to provide a peripheral area or space 43. The peripheral area 43 can partially or completely surround the die attach areas 42 to provide space for subsequent vertical, through package interconnections, and an area for fan-out routing or build-up interconnect structures, as well as other components such as SMD passives.

FIG. 2A shows forming a build-up interconnect structure 70 over the carrier 40 to electrically connect, and provide routing between, the subsequently mounted semiconductor die 14 (through conductive bumps 28) and the conductive interconnects 152. While the build-up interconnect structure 70 is shown comprising three conductive layers and three insulating layer, a person of ordinary skill in the art will appreciate that fewer layers (such as a single routing layer or RDL) or more layers can be used depending on the configuration and design of the semiconductor device 190. In some instances, an interface layer, such as double sided tape or a UV release tape can be disposed over the carrier 40, before the formation of build-up interconnect structure 70, to facilitate the subsequent removal of the temporary carrier. In other instances, such as when carrier 40 is a rigid RDL substrate that will not be subsequently removed, the interface layer will not be included.

The build-up interconnect structure 70 can optionally comprise a first insulating or passivation layer 72 formed or disposed over the reconstituted carrier 40. The first insulating layer 72 can comprise one or more layers of $SiO_2$, $Si_3N_4$, SiON, $Ta_2O_5$, $Al_2O_3$, polymer, polyimide, benzocyclobutene (BCB), polybenzoxazoles (PBO), or other material having similar insulating and structural properties. The insulating layer 72 can be formed using PVD, CVD, printing, spin coating, spray coating, sintering or thermal oxidation. Openings or first level conductive vias can be formed through the insulating layer create space for the subsequently formed first conductive layer 74, or for UBM pads 182, which can be formed as part of the build-up interconnect structure 70, or subsequently, to provide electrical package input/outputs for semiconductor devices 190.

A first conductive layer 74 can be formed over the carrier 40 and over the first insulating layer 72 as a first RDL layer to extend through the openings in the first insulating layer 72, to electrically connect with UBM pads 82. Conductive layer 74 can be one or more layers of Al, Cu, Sn, Ni, Au, Ag, or other electrically conductive material formed using a patterning and metal deposition process such as sputtering, electrolytic plating, and electroless plating, or other suitable process.

A second insulating or passivation layer 76, which can be similar or identical to the first insulating layer 72, can be disposed or formed over the reconstituted panel 158, the first conductive layer 74, and the first insulating layer 72. An opening or second level conductive via can be formed through the second insulating layer 76 to connect with the first conductive layer 74.

A second conductive layer 78, which can be similar or identical to the first conductive layer 74, can be formed as a second RDL layer over reconstituted panel 158, over the first insulating layer 72, over the first conductive layer 74, over the second level conductive via, or within an opening of the second insulating layer 72, to electrically connect with the first conductive layer 74, to provide electrical interconnection with the semiconductor die 14.

A third insulating or passivation layer 80, which can be similar or identical to the first insulating layer 72, can be disposed or formed over the second conductive layer 78 and the second insulating layer 76. An opening or a third level conductive via can also be formed in or through the third insulating layer 80 to connect with the second conductive layer 78, such as pads formed as part of the second conductive layer 78 to receive the subsequently mounted semiconductor die 14 and the conductive bumps 28 coupled to the semiconductor die 14.

Figure 2B:
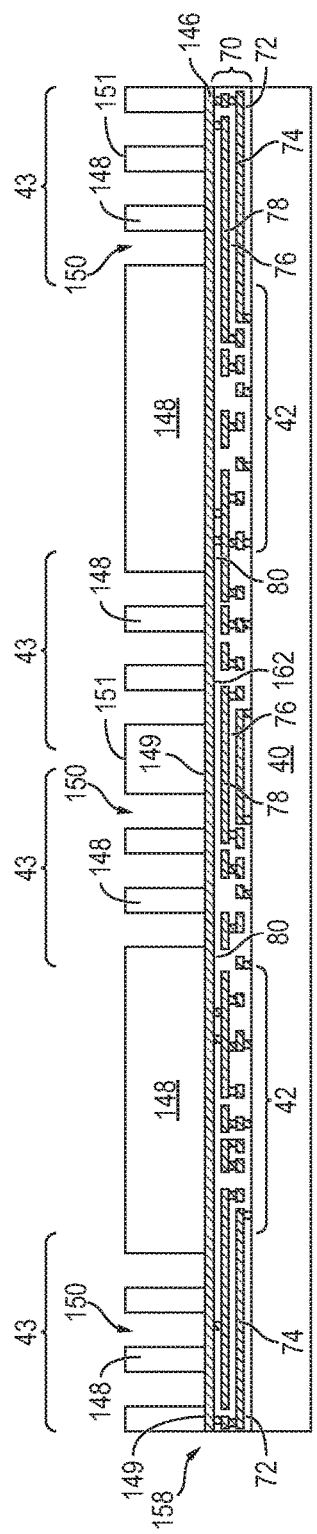

FIG. 2B shows forming a seed layer 146 over the carrier 40 and the interconnect structure 70, so that the seed layer 146 may be in direct contact with a conductive layer of the interconnect structure 70, or the rigid RDL substrate. The seed layer 146 can be one or more layers of Al, Cu, Sn, Ni, Au, Ag, or other suitable electrically conductive material. The formation, placement, or deposition of the seed layer 146 can be with PVD, CVD, electrolytic plating, electroless plating, or other suitable process. In some embodiments, the seed layer 146 can include Ti/Cu, TiW/Cu, or a coupling agent/Cu. The seed layer 146 can be deposited by sputtering, electroless plating, or by depositing laminated foil, such as Cu foil, combined with electroless plating.

FIG. 2B also shows forming or depositing a resist layer or photosensitive layer 148 over the carrier 40, the interconnect structure 70, and the seed layer 146. After formation of the resist layer 148 over the carrier, the resist layer 148 can then be exposed and developed to form openings 150 in the resist layer 148. The openings 150 can be positioned over, or within a footprint of, the peripheral area 43 of the carrier 40. The openings 150 can extend completely through the resist layer 148, such as from a first surface or bottom surface 149 of the resist layer 148 to second surface or top surface 151 of the resist layer 148 opposite the first surface 149. An after development inspection (ADI) of the developed resist layer 148 and the openings 150 can be performed to detect the condition or quality of the openings 150. After the ADI of resist layer 148 and openings 150, a descum operation can be performed on the developed resist layer 148.

Figure 2C:
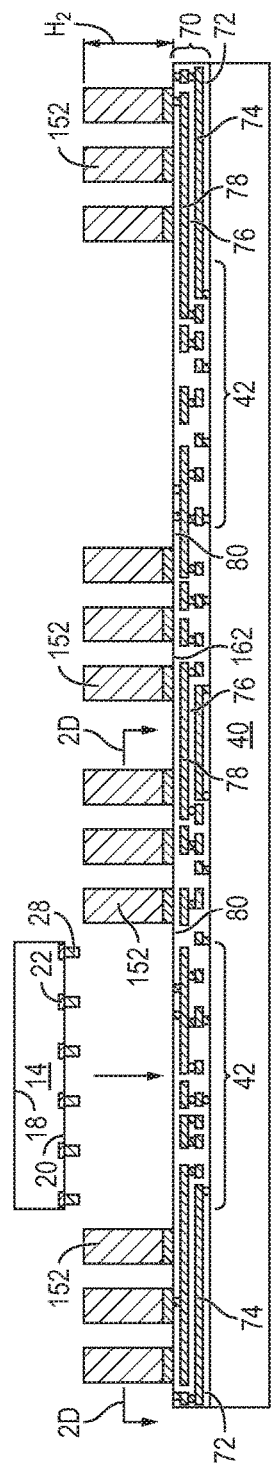

FIG. 2C shows the formation of a plurality of conductive interconnects 152 within the resist layer 148 that can be formed as columns, pillars, posts, bumps, or studs that are formed of copper or other suitable conductive material. Conductive interconnects 152 can be formed using patterning and metal deposition processes such as printing, PVD, CVD, sputtering, electrolytic plating, electroless plating, metal evaporation, metal sputtering, or other suitable metal deposition process. When conductive interconnects 152 are formed by plating, the seed layer 146 can be used as part of the plating process. Conductive interconnects 152 can be one or more layers of Al, Cu, Sn, Ni, Au, Ag, Pd, solder, or other suitable electrically conductive material and can include one or more layers. When forming the conductive interconnects 152 of multiple portions, such as vertically stacked portions of different conductive materials, the plating or formation of the conductive interconnects 152 can be part of multiple sequential processes. The formation of the conductive interconnects 152 comprising multiple vertically stacked portions of different materials is discussed in greater detail with respect to FIG. 3A-3C.

After formation of the conductive interconnects 152, the resist layer 148 can be removed, such as by a stripping process, leaving conductive interconnects 152 in the peripheral area 43 around the semiconductor die mounting sites 42 to provide for subsequent vertical or three dimensional (3D) electrical interconnection for the semiconductor devices 190. Conductive interconnects 152 can include a height H2 in a range of 100-300 μm or a height in a range of 150-250 μm, or a height of about 200 μm.

After removal of the resist layer 148, the semiconductor die mounting sites 42 on or over the carrier 40, the interconnect structure 70, or both, can be exposed and ready to receive the semiconductor die 14. The semiconductor die 14 can then be mounted face down with the active surface 20 oriented toward the carrier 40 or interconnect structure 70 to which the semiconductor die 14 are mounted. The semiconductor die 14 may be attached or coupled to the interconnect structure 70 or pre-fabricated RDL layers using a flip-chip attach method, such as mass reflow, thermo-compression bonding, or similar method.

Alternatively, in some instances, the orientation of semiconductor die 14 may be either face up with active surface 20 oriented away from the carrier 40 and the interconnect structure 70 to which the semiconductor die 14 are mounted.

Other components, such as surface mount devices (SMD), passives, or other suitable devices 155, may be mounted to the interconnect structure 70 or carrier 40, and attached using solder reflow or other suitable method. An example of the other component 155 included within the device 190 is shown, e.g., in FIG. 2H. The mounting of the other components 155 may occur at, or about, a same time as the semiconductor die 14 are mounted or placed on the interconnect structure 70 or carrier 40. Mounting the other components 155 about the same time as the semiconductor die 14 may include after the formation of conductive interconnects 152, interconnect structure 70, or wafer 40, and before placement of the encapsulant or mold compound 156.

Furthermore, while the above description has focused on the formation of the conductive interconnects 152 as being formed over the interconnect structure 70 or carrier 40, such as by plating, they need not be so formed. Alternatively, or additionally, conductive interconnects 152 may be formed as one or more discreet or interconnected units and then mounted or placed, fully or partially formed, over the interconnect structure 70 or carrier 40, and then coupled or attached thereto. For example, the conductive interconnects 152, which may be formed as thermal instrument components, through mold posts, or Cu posts, and may be attached to the RDL layer and connected using solder reflow, or other suitable method.

FIG. 2D shows a top or plan 152, taken along the section line 2D from FIG. 2C, of a portion of the carrier 40 or interconnect structure 70 and the conductive interconnects 152. FIG. 2D shows that the conductive interconnects 152 can be formed within, and extend intermittently across, the peripheral area 43 and surround the semiconductor die mounting sites 42 without being formed within the semiconductor die mounting sites 42.

FIG. 2E shows that after mounting the semiconductor die 14 over the carrier 40 or to the interconnect structure 70 (and at times the SMD 155), a mold compound or encapsulant 156 can be deposited around the plurality of semiconductor die 14 using a paste printing, compression molding, transfer molding, liquid encapsulant molding, lamination, vacuum lamination, spin coating, or other suitable applicator. The mold compound 156 can be a polymer composite material, such as epoxy resin with filler, epoxy acrylate with filler, or polymer with proper filler. Semiconductor die 14 (and SMD 155 when present) can be embedded together in mold compound 156, which can be non-conductive and environmentally protect the semiconductor die 14 from external elements and contaminants. The mold compound 156 can be formed adjacent to and directly contact all lateral sides of the semiconductor die (such as four sides), as well as be formed over the backside 18 and the active surface 20 of the semiconductor die 14. The mold compound 156 can also be formed around and directly contact the sides of the conductive bumps 28 so that during molding the mold compound 156 will underfill a gap between the interconnect structure 70 or RDL layer and the active surface 20 of the semiconductor die 14. The mold compound 156 can also be formed around and directly contact the conductive interconnects 152 to form a reconstituted panel, reconstituted wafer, molded panel, or molded wafer 158.

In some instances, rather than a single or unitary mold compound 156 being used to encapsulate the semiconductor die and conductive bumps 28 in a single step, as described above, a second or additional material, such as a capillary underfill material or underfill 157, can be used to fill the gap between each semiconductor die 14 and the interconnect structure 70 or carrier 40 prior to applying the mold compound 156 around the die 14 and the conductive interconnects 152 to form the reconstituted panel 158.

The reconstituted panel 158 can optionally undergo a curing process or post mold cure (PMC) to cure the mold compound 156. In some instances, a top surface, front surface, or first surface 166 of the mold compound 156 can be substantially coplanar with first end 153 of the conductive interconnects 152, such that the first ends 153 of the conductive interconnects 152 are exposed with respect to the encapsulant 156. Alternatively, the top surface 166 of the mold compound 156 can cover, be over, offset, or vertically separated from the first ends 153 of the conductive interconnects 152, such that the first ends 153 of the conductive interconnects 152 are not exposed with respect to the encapsulant 156 until after the reconstituted wafer 158 undergoes a grinding operation.

The reconstituted panel 158 can also undergo an optional grinding operation with grinder 164 to planarize the top surface, front surface, or first surface 168 of the reconstituted panel 158 and to reduce a thickness of the reconstituted panel 158, and to planarize the top surface 166 of the mold compound 156 and to planarize the top surface 168 of the reconstituted panel 158. The top surface 168 of the reconstituted panel 158 can comprise the top surface 166 of the mold compound 156, the first ends of the conductive interconnects 152, or both. A chemical etch can also be used to remove and planarize the mold compound 156 and the reconstituted panel 158. Thus, the top surface 168 of the conductive interconnects 152 can be exposed with respect to mold compound 156 in the peripheral area 43 to provide for electrical connection between semiconductor die 14 and a subsequently formed redistribution layer or build-up interconnect structure.

When the first ends of the conductive interconnects 152 are exposed through mold compound 156, whether after grinding or not, the backside 18 of the semiconductor die 14 may, and in many cases will not, be exposed. Instead, the backside 18 of the semiconductor die 14 may or will be covered with a thickness 159 of encapsulant 156, so that the first ends of the conductive interconnects 152 are exposed through mold compound 156, but the backside 18 of semiconductor die 14 are not exposed.

The reconstituted wafer 158 can also undergo a panel trim or trimming to remove excess mold compound 156 that has remained in undesirable locations as a result of a molding process, such as eliminating a flange present for a mold chase. The reconstituted panel 158 can include a footprint or form factor of any shape and size including a circular, rectangular, or square shape, the reconstituted wafer 158 comprising a diameter, length, or width of 200 millimeter (mm), 300 mm, or any other desirable size.

FIG. 2E shows the exposed first ends 153 of the conductive interconnects 152 can also undergo a coating or pad finishing process, such as by an Organic Solderability Preservative (OSP) coating, solder printing, electroless plating, or other suitable process, to form a PoP UBM pad, UBM structures, or land pads 186. The UBMs 186 can comprise a multiple metal stack of one or more of an adhesion layer, barrier layer, seed layer, or wetting layer. The adhesion layer can comprise Ti, TiN, TiW, Al, or Cr. The barrier layer can be formed over the adhesion layer and can be made of Ni, NiV, Pt, Pd, TiW, or CrCu. The barrier layer can inhibit unwanted diffusion of material, like Cu. The seed layer can be Cu, Ni, NiV, Au, or Al. The seed layer can be formed over the conductive interconnects 152 and can act as an intermediate conductive layer below subsequently formed PoP bumps, balls, or interconnect structures. In some instances, the UBMs 186 can comprise Ni and Au. UBMs 186 can provide a low resistive interconnect as well as a barrier to solder diffusion and seed layer for solder wettability.

FIG. 2F also shows removing the carrier 40, to expose the interconnect structure 70 coupled to the second ends 154 of the conductive interconnects 152. The carrier 40 can be removed, e.g., by grinding the carrier 40, by exposing UV release tape to UV radiation to separate the UV tape from the glass substrate 40, or other suitable method. After removal of the carrier 40, the reconstituted panel 158 can also undergo an etching process, such as a wet etch, to clean the surface of the reconstituted panel 158 exposed by removal of the carrier 40, including the exposed second ends 154 of the conductive interconnects 152. In other instances, when the carrier 40 is not a temporary carrier, such as when a rigid RDL substrate is used, no removal of the carrier occurs, and the second ends 154 of the conductive interconnects 152 are already coupled to the rigid RDL substrate for electrical interconnection.

When not previously formed as part of the interconnect layer 70, conductive UBMs 182 can be formed over, and coupled the conductive layers within the build-up interconnects structure 70, such as conductive layer 74 (or with conductive layers within the rigid RDL substrate, when present) as well as electrically connect to the semiconductor die 14, the conductive bumps 28, and the conductive interconnects 152. UBMs 182, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently formed bumps, balls, or interconnect structures 184. In some instances, the wetting layer can comprise a layer of Cu with a thickness in a range of about 5-11 μm or 7-9 μm. Bumps 184, such as when formed of SnAg solder, can consume some of the Cu UBM during reflow and forms an intermetallic compound at the interface between the solder bump 184 and the Cu of the wetting layer. However, the Cu of the wetting layer can be made thick enough to prevent full consumption of the Cu pad by the solder during high temperature aging.

In some instances, the UBMs 182 can comprise Ni, Pd, and Au. UBMs 182 can provide a low resistive interconnect to build-up interconnect structure 70 as well as a barrier to solder diffusion and seed layer for solder wettability.

Opposite the UBMs 186, bumps, balls, or interconnect structures 184, can be formed on the UBM pad 182 and over the build-up interconnect structure 70, or coupled to the rigid RDL substrate. The bumps 184 can be formed by depositing an electrically conductive bump material over UBMs 182 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to UBMs 182 using a suitable attachment or bonding process. In one embodiment, the bump material is reflowed by heating the material above its melting point to form spherical balls or bumps 184. In some applications, bumps 184 are reflowed a second time to improve electrical contact to UBMs 182. The bumps 184 can also be compression bonded or thermocompression bonded to the UBM layer 182. Bumps 184 represent one type of interconnect structure that can be formed over UBM 182. The interconnect structure can also use bond wires, conductive paste, stud bump, micro bump, or other electrical interconnects. In some instances, the bumps 184 may be omitted to provide for an LGA package format. In lieu of solder balls, plated flip-chip bumps could be formed on the bottom surface of the package.

FIG. 2F also shows singulation of the molded panel 158 and build-up interconnect structure 70 with saw blade or laser cutting tool 188 to form individual semiconductor devices or packages 190.

Figure 2G:
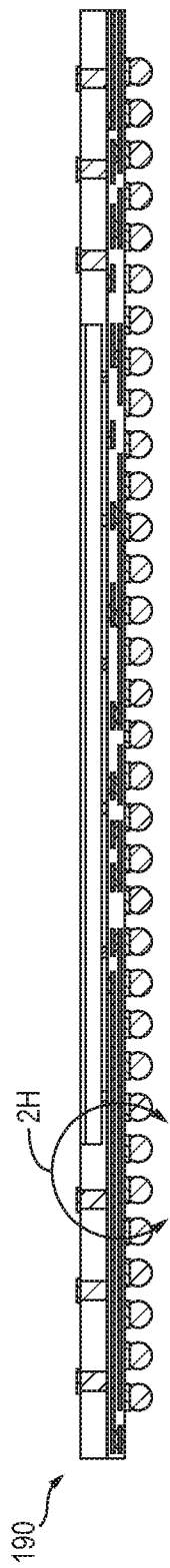

FIG. 2G shows a cross-sectional profile view of a final semiconductor device 190 with peripheral conductive interconnect structures 152 disposed around, and laterally offset from, the semiconductor die 14 and within the encapsulant material 156. The peripheral conductive interconnect structures 152 can extend completely through the encapsulant 156 in a vertical direction from the top surface 166 of the encapsulant 156 to the bottom surface 162 of the encapsulant 156 opposite top surface 166 to provide vertical electrical interconnection through the semiconductor device 190, which can facilitate stacking of packages in package on package (PoP) arrangements.

Figure 2H:
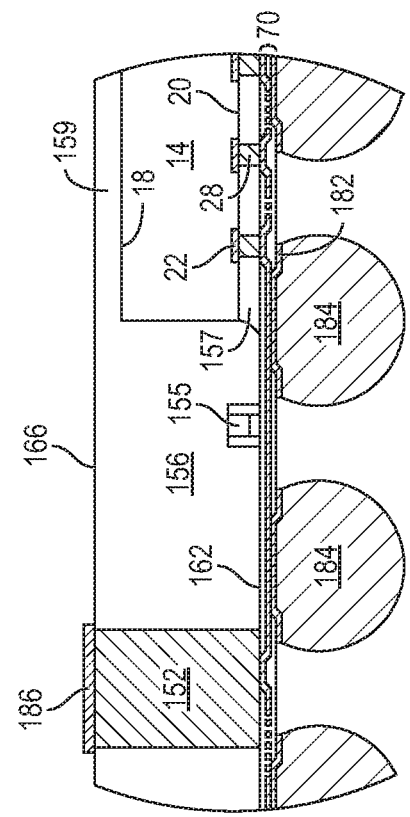

FIG. 2H shows a close-up view of a portion of the cross-sectional profile view of the semiconductor device 190 shown in FIG. 2G, taken at the section line 2H. FIG. 2H shows that the backside 18 of the die 14 can be covered by thickness 159 of encapsulant 156, so the backside 18 of the semiconductor die 14 is not exposed at an exterior of the package or device 190. The thickness 159 of encapsulant 156 over the backside 18 of the semiconductor die 14 as part of the semiconductor device 190 can balance a thermal expansion mismatch at both sides 18, 20 of the semiconductor die 14, thereby reducing warpage of the package 190. FIG. 2H also shows SMD 155 included within the final package 190.

Figure 3A:
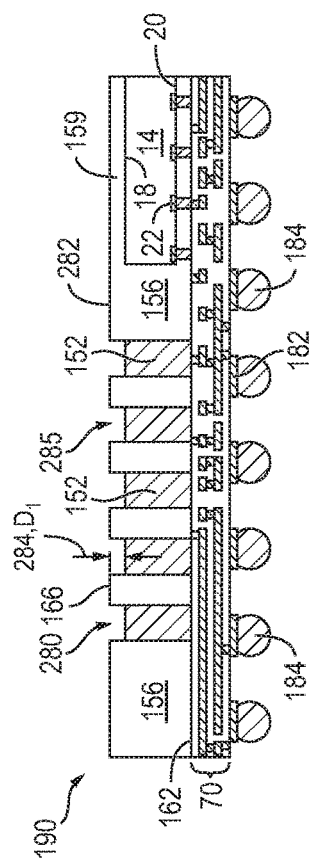
FIGS. 3A-3C illustrate an aspect of partially etched fully molded peripheral PoP devices.
Figure 3B:
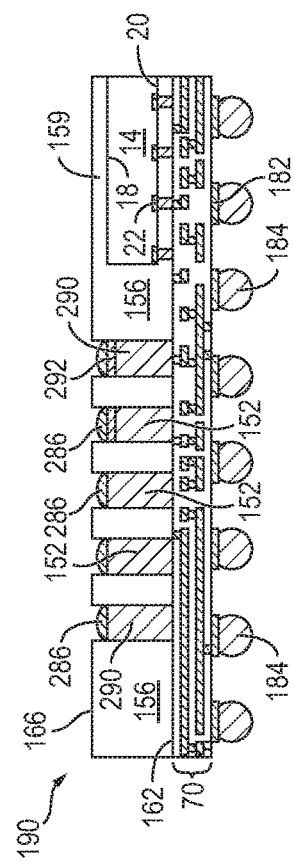
Figure 3C:
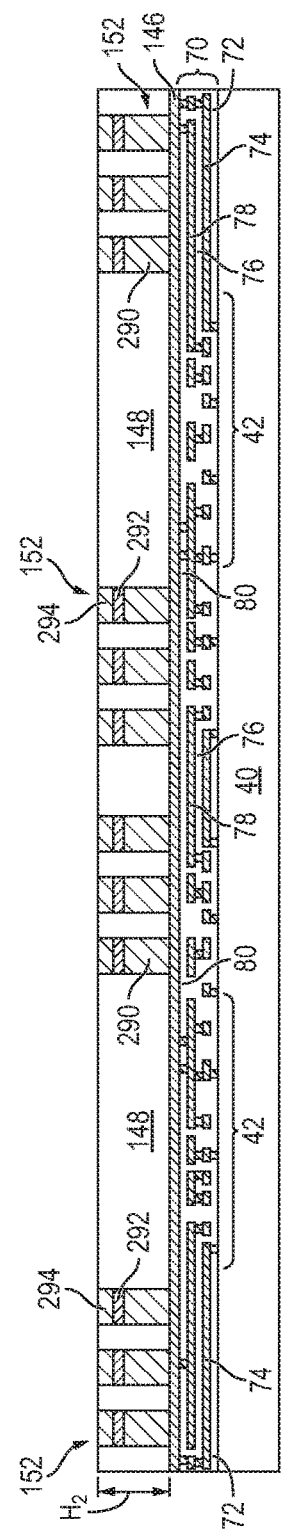

FIGS. 3A-3C can continue from, and include the features or elements shown in and described with respect to, FIGS. 2A-2H. Continuing from FIG. 2E, FIG. 3A shows the reconstituted panel 158 and build-up interconnect structure 70 having undergone an additional process, step, or feature of removing the carrier 40, and the attachment or formation of bumps 184, as described in FIG. 2F.

FIG. 3A also shows the omission of the PoP UBM pads 186 from FIG. 2F with the additional feature of a plurality of recesses or etched recesses 280 disposed along a top surface or first surface 282 of the package 190. In some instance, the top surface 282 of the semiconductor device 190 can be coplanar or coextensive with the top surface 166 of the mold compound 156, and can also be coplanar or coextensive with the top surface 168 of the reconstituted panel 158. The recesses 280 can be formed by etching or removing a portion of the conductive interconnects 152 to form an offset, gap, or distance 284 with a depth D1. The depth D1 can extend from the top surface 285 of the conductive interconnects 152 to the top surface 282 of the semiconductor device 190 or the top surface 166 of the mold compound 156. In some instances, the depth D can be in a range of, or about, 1-30 µm, or 1-20 µm, or 1-10 µm. The offset 284 allows the top surface 285 of the conductive interconnects 152 to be offset, recessed, or lowered with respect to the top surface 282 of the semiconductor device 190, which in turn can reduce a height of multiple packages or semiconductor devices, such as semiconductor devices 190, when mounted on top of one another in a PoP arrangement.

FIG. 3B, continuing from FIG. 3A, shows a solder bump, bump, ball, or interconnect 286 can be disposed within the recess 280 in the encapsulant 156 over the conductive interconnects 152. The solder bump 286 can be formed using a solder paste or cap, such as a tin silver (SnAg) paste or cap or other suitable material, that can be formed with a solder paste print or ball drop and reflow process to facilitate stacking of multiple packages in a PoP configuration. In other instances, the solder bump can be reflowed from an etch stop layer or material deposited during the formation of the conductive interconnect 152, as described in greater detail below with respect to FIG. 3C. In any event, and notwithstanding the method of formation, the solder bump 286, such as when formed as a SnAg cap, can be less expensive than the PoP UBM pad 186 formed with a NiAu finish, as discussed with respect to FIG. 2F. Inclusion of the cap 286 shown in FIG. 3B can improve a yield of semiconductor devices 190 and help reduce package failures resulting from package warping. Additionally, the mold compound 156 and the thickness 159 of encapsulant 156 formed over the backside 18 of the semiconductor die 14 can also help improve performance of the semiconductor devices 190 during thermal cycling as well as reduce warpage of the semiconductor devices 190.

FIG. 3C, similar to FIGS. 2A and 2B or FIGS. 3A and 3B, shows the conductive interconnects 152 can be formed comprising multiple portions or layers, including a first portion 290, an etch stop layer 292, and a second portion 294. The first portion 290 of conductive interconnect 152 can be formed over, and in direct contact with, the carrier 40 or rigid RDL substrate, as well as the interconnect layer 70. After forming the first portion 290, an etch stop layer 292 can be formed by plating, or by another suitable process, over the first portion 290 of the conductive interconnect 152. After forming the etch stop layer 292, a second portion 294 of the conductive interconnect 152 can be formed over the etch stop layer 292 and over the first portion 290 of the conductive interconnect 152. In some instances, footprints of the first portion 290, the etch stop layer 292, and the second portion 294 can be equal or substantially equal with respect to each other, such as within a range of 0-10% of each other.

The first portion 290 and the second portion 294 of the conductive interconnect 152 can be formed of a same or similar material, such as copper, or any other suitable material as described above with respect to the conductive interconnect 152. In some instances, the etch stop layer 292 can be formed as a thin layer of material different from the material forming the first portion 290 and the second portion 294 of the conductive interconnects 152. The thin layer of etch stop material 292 can comprise a thickness of 1-80 µm, 5-65 µm, 15-50 µm, 20-40 µm, or thereabout, such as plus or minus 1-20 percent. The etch stop layer 292 can be formed of a metal such as Au, Ag, or solder. In some instances, the first portion 290 and the second portion 294 will be formed of materials that will be etched by, or respond to, a first etching chemistry, and the etch stop layer 292 will be formed of a material that will not respond to the first etching chemistry, or will respond to the first etching chemistry at a substantially reduced rate such as at a rate that is only 0-10%, 0-5%, or less than 2% of the rate of the first etching chemistry. Conversely, the etch stop layer 292 will respond to a second etching chemistry, while the first portion 290 and the second portion 294 will not respond, or respond at a substantially reduced rate to the second etching chemistry, such as 0-10%, 0-5%, or less than 2% of the rate of the second etching chemistry. For instance, the etch stop layer 292 can be formed of a material that is not etched by the first etching chemistry that etches copper; and the second portion 294 of the conductive interconnect 152 can be formed of a copper material that is not etched by the second etching chemistry that etches the etch stop layer 292.

Accordingly, instead of simply etching a plurality of conductive interconnects 152 without the etch stop layer 292 (as shown in FIG. 3A) and relying on uniformity of the etching process to produce etched interconnects 152 of uniform height, or recesses 280 of uniform depth D1, the first portion of the conductive interconnects 152 can be over-etched. Over-etching as used herein can refer to exposing at least a part of the conductive interconnect 152 to the etch chemistry longer than required or normally required in order to achieve the desired etch depth. Over-etching the first portions 290 of the conductive interconnects 152 can ensure that all of the first portions 290 are completely, entirely, or substantially removed, while the etch stop layer 292 that is not etched by the first etching chemistry remains intact. As such, the heights of the etched interconnects 152 comprise uniform heights that comprise the heights of the second portions 294 and etch stop layers 292. Furthermore, the uniform heights of the etched interconnects 152 need not rely on the uniformity of etching rates, which in some instance can vary across the reconstituted panel 158. Instead, the uniformity of height of the etched conductive interconnects 152 and the uniformity of the depth D of recesses 280 depends on the uniformity of the formation of the first portion 290 and the etch stop layer 292, such as by plating, which can be more precise and uniform than the precision and uniformity of the etching process. Thus, over-etching can ensure a consistent etch depth, or depth D1 of recesses 280, and full removal of the desired amount of the first portion 290, even if there is variability in the removal of the first portion during etching with the first etching chemistry.

When the etch stop layer 292 is present, such as is shown in FIGS. 3B and 3C, treatment of the etch stop layer 292 can vary based on various aspects, designs, or embodiments of the semiconductor device 190. The inclusion of FIG. 3B with the illustration of the conductive interconnects 152 on the left of FIG. 3B without the etch stop layer 292 in the final semiconductor device 190, and the conductive interconnects 152 on the right of FIG. 3B with the etch stop layer 292 in the final semiconductor device 190, provides support for multiple arrangements of the conductive interconnects 152, which can be uniformly included in different semiconductor devices 190, and not necessarily with variation among different uses of the etch stop layer 292 within the same semiconductor device 190 as shown in FIG. 3B.

In some instances where the etch stop layer 292 is included as part of the conductive interconnect 152, the etch stop layer 292 can be formed as a solderable surface finish that remains over the second portion 294 of the conductive interconnect 152 when the conductive bump 286 is coupled to the conductive interconnect. Thus, the etch stop layer 292 can be positioned between, and be in direct contact with both of, the first portion 290 of the conductive interconnect 152 and the conductive bump 286, as shown in FIG. 3B.

In other instances, where the etch stop layer 292 is included as part of the conductive interconnect 152, the etch stop layer 292 can be reflowed to form the conductive bump 286, or a portion of the conductive bump 286, after etching the first portion 290 of the conductive interconnect 152 to expose the etch stop layer 292. As such, the relative sizing or heights of the first portion 290, the etch stop layer 292, and the second portion 294 can vary according to desired configurations and designs of the final semiconductor device 190. In some instances, a top of the solder bump 286 can be substantially planar with, or at a same height as, the top surface 282 of the semiconductor device 190. In other instances, the top of the solder bump 286 can be at a different height than, or offset with respect to, the top surface 282 of the semiconductor device 190.

Depending of the final use or application of the etch stop layer 292, the vertical position or height of the etch stop layer 292 within the conductive interconnect 152 can vary. As the vertical position of the etch stop layer 292 varies within the conductive interconnect 152, the heights or relative heights of the first portion 290 and the second portion 294 can also vary within the conductive interconnects 152. In some instances, heights of the first portion 290 and the second portion 294 can be equal or substantially equal, so as to place the etch stop layer 232 at a midpoint or center of the conductive interconnects 152, as well as being spaced equidistantly from the top surface 168 of the reconstituted panel 158 and the bottom surface 169 of the reconstituted panel 158.

While this disclosure includes a number of embodiments in different forms, there is the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:
   providing a carrier comprising a semiconductor die mounting site;
   forming a build-up interconnect structure over the carrier;
   forming a first portion of a conductive interconnect over the build-up interconnect structure in a periphery of the semiconductor die mounting site;
   forming an etch stop layer over the first portion of the conductive interconnect;
   forming a second portion of the conductive interconnect over the etch stop layer and over the first portion of the conductive interconnect;
   mounting a facedown semiconductor die to the build-up interconnect at the semiconductor die mounting site;
   encapsulating the conductive interconnect and semiconductor die with a mold compound;
   exposing a first end of the conductive interconnect on the second portion of the conductive interconnect;
   removing the carrier to expose the build-up interconnect structure; and
   etching the first portion of the conductive interconnect to expose the etch stop layer.

2. The method of claim 1, further comprising forming the etch stop layer as a solderable surface finish that remains over the first portion of the conductive interconnect when the first portion of the conductive interconnect is coupled to a conductive bump.

3. The method of claim 1, further comprising:
   forming the etch stop layer of a material that is not etched by a first etching chemistry that etches the second portion of the conductive interconnect; and
   forming the second portion of the conductive interconnect of a copper material that is not etched by a second etching chemistry that etches the etch stop layer.

4. The method of claim 1, further comprising exposing the first end of the conductive interconnect with a grinding process that removes a portion of the mold compound.

5. The method of claim 1, wherein forming the etch stop layer comprises forming a layer of solder comprising a thickness in a range of 20-40 µm.

6. The method of claim 5, further comprising reflowing the solder etch stop layer to form a bump after etching the second portion of the conductive interconnect to expose the etch stop layer.

7. A method of making a semiconductor device, comprising:
   providing a redistribution layer (RDL) comprising a die mounting site;
   forming conductive interconnects over the redistribution layer in a periphery of the semiconductor die mounting site;
   mounting a facedown semiconductor die to the RDL at the semiconductor die mounting site;
   encapsulating the conductive interconnects and semiconductor die with mold compound after forming the conductive interconnects;
   exposing first ends of the conductive interconnects; and
   etching the conductive interconnects to recess the first ends of the conductive interconnects with respect to the mold compound.

8. The method of claim 7, wherein providing the RDL further comprising forming a build-up interconnect structure, the build-up interconnect structure connecting the semiconductor die and the conductive interconnects.

9. The method of claim 7, further comprising disposing a underfill material between the facedown semiconductor die and the RDL.

10. The method of claim 7, further comprising mounting a surface mount device (SMD) to the RDL adjacent the semiconductor die and the conductive interconnects.

11. The method of claim 7, wherein each of the conductive interconnects comprise:
a first portion;
a second portion; and
an etch stop layer disposed between the first portion and the second portion.

12. The method of claim 11, further comprising:
forming the etch stop layer of solder; and
reflowing the solder etch stop layer to form a bump after etching the second portion of the conductive interconnects to expose the etch stop layer of each conductive interconnect.

13. The method of claim 11, further comprising forming the etch stop layer as a surface finish that remains over the first portion of the conductive interconnects.

14. A method of making a semiconductor device, comprising:
providing a carrier comprising a redistribution layer (RDL) as part of a build-up interconnect structure disposed over a temporary carrier, the carrier further comprising a semiconductor die mounting site;
disposing conductive interconnects over the carrier and RDL in a periphery of the semiconductor die mounting site;
mounting a semiconductor die coupled to the RDL at the semiconductor die mounting site;
encapsulating the conductive interconnects and semiconductor die with mold compound; and
exposing first ends of the conductive interconnects.

15. The method of claim 14, further comprising:
providing an offset between an end of each of the conductive interconnects with respect to a surface of the mold compound; and
providing a solder bump over the end of each of the conductive interconnects.

16. The method of claim 14, further comprising land pads coupled to the conductive interconnects and to the RDL.

17. The method of claim 14, wherein the conductive interconnects are formed before being coupled to the RDL.

18. The method of claim 14, wherein mounting the semiconductor die to the RDL at the semiconductor die mounting site further comprises mounting the semiconductor die facedown.

19. The method of claim 14, wherein each of the conductive interconnects further comprise:
a first portion;
a second portion; and
an etch stop layer disposed between the first portion and the second portion.

20. The method of claim 19, further comprising forming the etch stop layer as a surface finish that remains over the first portion of the conductive interconnects.

21. The method of claim 19, further comprising:
forming the etch stop layer of solder; and
reflowing the solder etch stop layer to form a bump after etching the second portion of the conductive interconnects to expose the etch stop layer of each conductive interconnect.

* * * * *